United States Patent
Kannan

(10) Patent No.: US 9,594,578 B2
(45) Date of Patent: Mar. 14, 2017

(54) HARDWARE IMPLEMENTATION OF A VIRTUAL MACHINE INTERPRETER

(75) Inventor: Shakthi Kannan, Hadapsar (IN)

(73) Assignee: Red Hat, Inc., Raleigh, NC (US)

( * ) Notice: Subject to any disclaimer, the term of this patent is extended or adjusted under 35 U.S.C. 154(b) by 175 days.

(21) Appl. No.: 13/407,130

(22) Filed: Feb. 28, 2012

(65) Prior Publication Data

US 2013/0227535 A1 Aug. 29, 2013

(51) Int. Cl.
*G06F 9/45* (2006.01)
*G06F 9/455* (2006.01)
*G06F 9/30* (2006.01)
*G06F 17/50* (2006.01)

(52) U.S. Cl.
CPC ...... *G06F 9/45504* (2013.01); *G06F 9/30174* (2013.01); *G06F 17/5054* (2013.01)

(58) Field of Classification Search
CPC ...... G06F 21/10; G06F 21/14; G06F 11/3419; G06F 15/16; G06F 8/65; G06F 12/0253; G06F 9/5077; G06F 9/30174; G06F 9/45504; G06F 9/45508
See application file for complete search history.

(56) References Cited

U.S. PATENT DOCUMENTS

| | | | | |
|---|---|---|---|---|
| 5,920,720 A * | 7/1999 | Toutonghi et al. | ........... | 717/148 |
| 6,289,512 B1 * | 9/2001 | Edwards | ................... | G06F 8/61 717/178 |
| 7,210,140 B2 * | 4/2007 | Lindwer et al. | .............. | 717/158 |
| 7,921,415 B1 * | 4/2011 | Bodell et al. | ................. | 717/139 |
| 2004/0010785 A1 * | 1/2004 | Chauvel | ............. | G06F 11/3419 717/158 |
| 2004/0158589 A1 * | 8/2004 | Liang | .................. | G06F 12/0253 |
| 2007/0169025 A1 * | 7/2007 | Moore | ...................... | G06F 8/65 717/139 |
| 2008/0137848 A1 * | 6/2008 | Kocher | ................... | G06F 21/10 380/201 |
| 2009/0327446 A1 * | 12/2009 | Wittenschlaeger | ..... | G06F 15/16 709/213 |
| 2010/0042585 A1 * | 2/2010 | Adler | ............................... | 707/3 |
| 2010/0042983 A1 * | 2/2010 | Vick et al. | ..................... | 717/153 |
| 2010/0100888 A1 * | 4/2010 | Tene | ...................... | G06F 9/5077 718/104 |
| 2010/0146304 A1 * | 6/2010 | Miyatake | ................. | G06F 21/14 713/194 |
| 2010/0333075 A1 * | 12/2010 | Asai | .................... | G06F 9/45508 717/139 |
| 2011/0016459 A1 * | 1/2011 | Meyers et al. | ................ | 717/139 |

(Continued)

OTHER PUBLICATIONS

A. Albert Raj and T. Latha, "VLSI Design", 2008, PHI Learning, 2008 Edition, p. 270-271.*

(Continued)

*Primary Examiner* — Tuan Vu
(74) *Attorney, Agent, or Firm* — Lowenstein Sandler LLP

(57) ABSTRACT

Methods and systems for implementing "virtual machine" interpreters in a hardware component. The virtual machine interpreter may be implemented in the hardware component (e.g., a processor) by configuring the hardware component to include programming language interpreter logic. The hardware component is configured to include multiple logic gates and arrays representing a hardware-based implementation of a virtual machine interpreter.

13 Claims, 5 Drawing Sheets

(56) References Cited

U.S. PATENT DOCUMENTS

2013/0019229 A1* 1/2013 Bohlmann et al. ........... 717/139

OTHER PUBLICATIONS

Margaret Rouse, "What is native code", Jan. 2006, http://searchsoa.techtarget.com/definition/native-code (WhatIs.com), (Whole Document).*
Tremblay, Marc et al.—"picoJava : A Hardware Implementation of the Java Virtual Machine", presented at the Hot Chips 8 Symposium on High Performance Chips on Aug. 19, 1996.

* cited by examiner

HARDWARE IMPLEMENTATION OF A VIRTUAL MACHINE INTERPRETER

TECHNICAL FIELD

Embodiments of the present invention relate to a computing system, and more specifically, relate to a system and method for implementing programming language interpreter logic in hardware.

BACKGROUND

Typical computing systems, particularly cloud-based systems, employ a hardware component (e.g., a processor) including computing instructions, on top of which is an operating system. In virtualized systems, one or more virtual machines (i.e., a software implementation of a machine) run on top of an operating system, and developers configure applications to run on the virtual machines.

In order to interpret the programming languages used to implement the applications (e.g., Ruby, Perl, Python), a virtual machine interpreter is employed. The virtual machine interpreter is a software program that executes (i.e., performs) instructions provided in the programming language which is native to the respective application. The virtual machine interpreter may either executes the source code directly, translates source the code into some efficient intermediate representation (i.e., code) and immediately executes this representation, or explicitly executes stored precompiled code made by a compiler which is part of the interpreter system.

In a typical arrangement, a user computer may submit a request (e.g., an HTTP request) to an application in a cloud computing environment for processing by a virtualized computing system. The user request is processed by the application and passed to the virtual machine interpreter (level 1), which in turn passes the interpreted request to the operating system (level 2), and the request is then passed to the hardware component for processing (level 3). In this regard, all of the programming languages of the one or more applications go through the virtual machine (e.g., the Java™ Virtual Machine) for interpretation as a software cycle running on a generic hardware component (e.g., a processor), adding to the overall computational expenditure associated with the request. As such, this three-level architecture including a virtual machine interpreter creates significant overhead in the management and processing of user requests, resulting in request processing times on the order of milliseconds.

DETAILED DESCRIPTION

Methods and systems for implementing "virtual machine" interpreters in a hardware component. The virtual machine interpreter may be implemented in the hardware component (e.g., a processor) by configuring the hardware component to include programming language interpreter logic. In an embodiment, the hardware component is configured to include multiple logic gates and arrays representing a hardware-based implementation of a virtual machine interpreter. The hardware-based configuration implementing the virtual machine interpreter is referred to herein as the "programming language interpreter logic". The hardware component (e.g., a processor) implemented with the programming language interpreter logic is referred to herein as the "interpreter-implemented hardware component" or "interpreter-implemented processor".

In an embodiment, the interpreter-implemented hardware component is configured to receive requests from multiple applications including source code in the application's native programming language (e.g., Ruby, Perl, Python). In an embodiment, the computing system includes an interpreter-implemented hardware component (also referred to as an "interpreter-implemented processor") configured to receive requests directly from the one or more applications and execute the source code to produce a response to the request.

In another embodiment, the computing system is employed with an operating system, such as Microsoft Windows®, Linux®, Solaris®, Mac® OS, etc. In this embodiment, requests from a user computer to an application are passed to the operating system, which then directly communicates an interpret request (i.e., a request for an interpretation of the application's programming language) to the interpreter-implemented processor, or sends the request to another processor (also referred to as a "co-processor"), which in turn off-loads or sends the associated interpret request to the interpreter-implemented processor. In another embodiment, the computing system according to a multi-processor arrangement wherein each application is assigned a dedicated co-processor and interpreter-implemented processor to handle user requests to the application.

Advantageously, the language interpreter hardware may be used as a standalone device, or in conjunction with a co-processor configured to off-load the interpreter requests to the language interpreter processor. In addition, the hardware-based interpreter according to embodiments of the present invention may be configured to handle cloud computing requests directly in the hardware. In an embodiment, the hardware-based interpreter may be replicated any number of times in hardware for parallel processing and increased scalability.

Figure 1A:
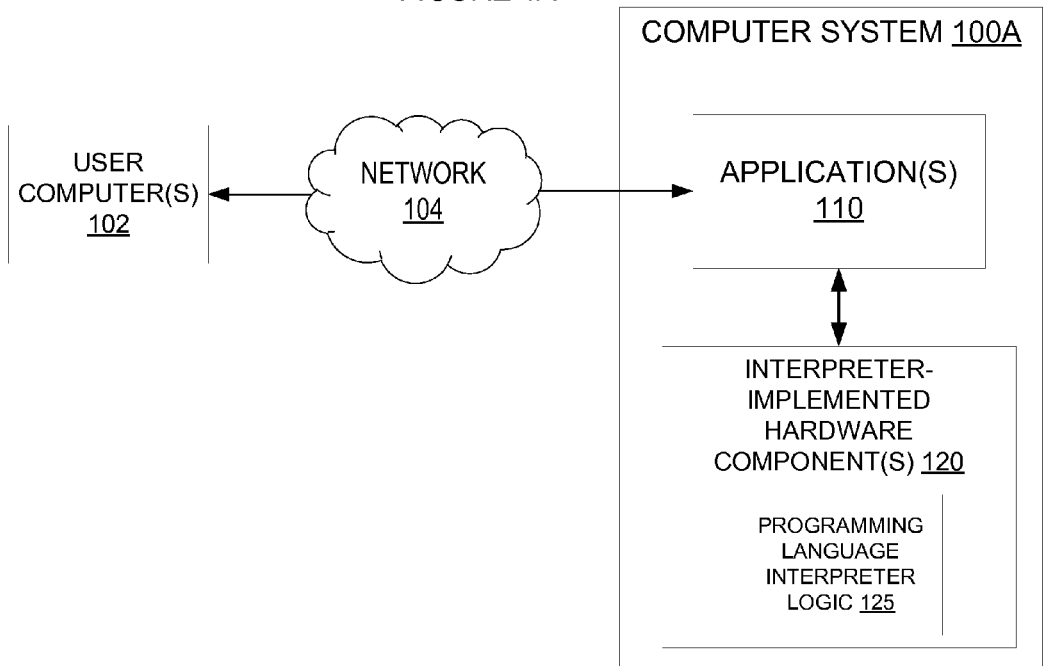
FIG. 1A is a block diagram of an exemplary computer architecture including an interpreter-implemented hardware component, according to an embodiment of the present invention.

FIG. 1A is a block diagram that illustrates an embodiment of a computer system 100A in which embodiments of the present invention may operate. The computer system 100A includes one or more applications 110 accessible by one or user computers via network 104. The computer system 100A may be a server, a workstation, a personal computer (PC), a mobile phone, a palm-sized computing device, a personal digital assistant (PDA), etc. In an embodiment, the computer system 100A may be implemented in a cloud-computing environment.

In embodiments of the present invention, the one or more user computers 102 may interact with the application(s) 110 using any suitable computing device configured to connect via a network 104, such as, for example, a mobile device (e.g., a phone), tablet, desktop computer, laptop computer, eBook reader, PDA, and the like. The network 104 may be a private network (e.g., a local area network (LAN), a wide area network (WAN), intranet, etc.) or a public network (e.g., the Internet).

As shown in FIG. 1A, the computer system 100A includes one or more interpreter-implemented hardware components 120 communicatively connected to the one or more applications 110. The interpreter-implemented hardware component(s) 120 includes a suitable hardware component configured to include a logical configuration representing a physical (i.e., hardware-based) implementation of a virtual machine interpreter (e.g., the Java™ virtual machine interpreter). In an embodiment, the hardware-based configuration implementing the virtual machine interpreter (i.e., the programming language interpreter logic) is an arrangement of physical components configured to perform the functionality, processing, and actions performed by a suitable virtual machine interpreter. Although one having ordinary skill in the art will appreciate that multiple interpreter-implemented hardware components 120 may be employed in the computer system 100A, in the description, the interpreter-implemented hardware component 120 may be referred to in the singular form for purposes of illustration.

In an embodiment, the interpreter-implemented hardware component 120 includes a hardware component, such as a processing device (e.g., a processor), configured to include multiple logic gates and arrays representing programming language interpreter logic 125. Exemplary processors for use in accordance with embodiments of the present invention include Intel® processors and ARM® processors. The programming language interpreter logic 125 is configured to implement or replicate the functionality of a virtual machine interpreter. Advantageously, the interpreter-implemented hardware component(s) 120 is configured to interpret the native programming language (or source code) of the one or more applications 110, and as such, a separate virtual machine interpreter is not employed. Accordingly, the one or more applications 110 may communicate (or "talk") directly with the interpreter-implemented hardware component 120, and the source code of the application 110 may be executed directly by the interpreter-implemented hardware 120.

Figure 2:
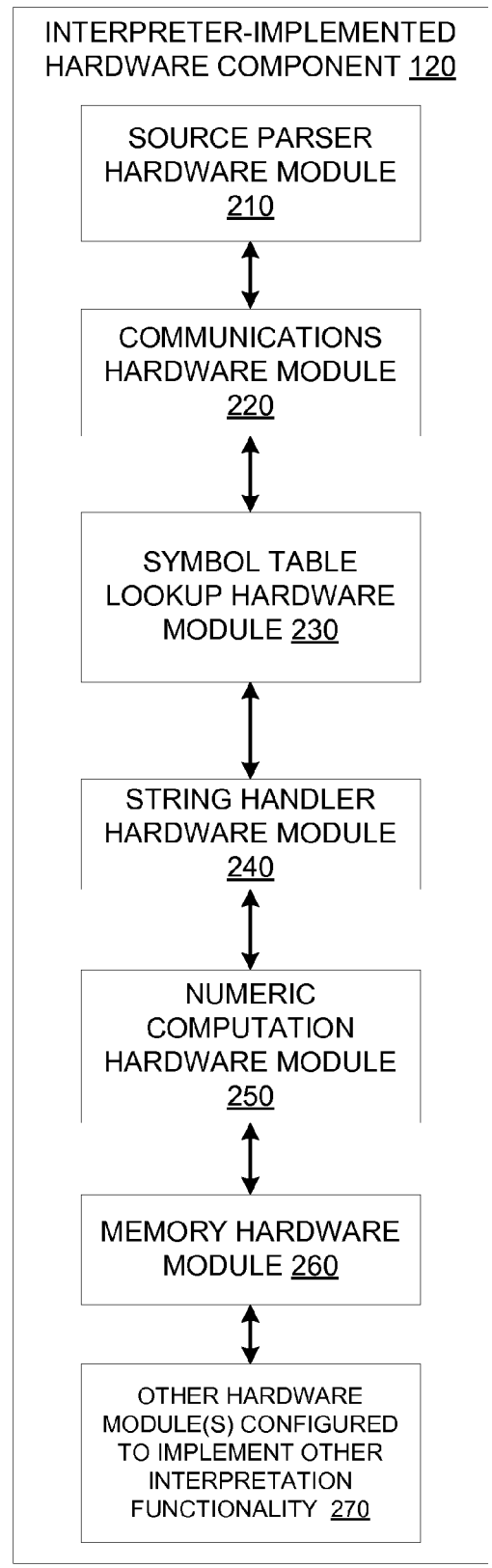
FIG. 2 is a block diagram of an exemplary interpreter-implemented hardware component, according to an embodiment of the present invention.
Figure 5:
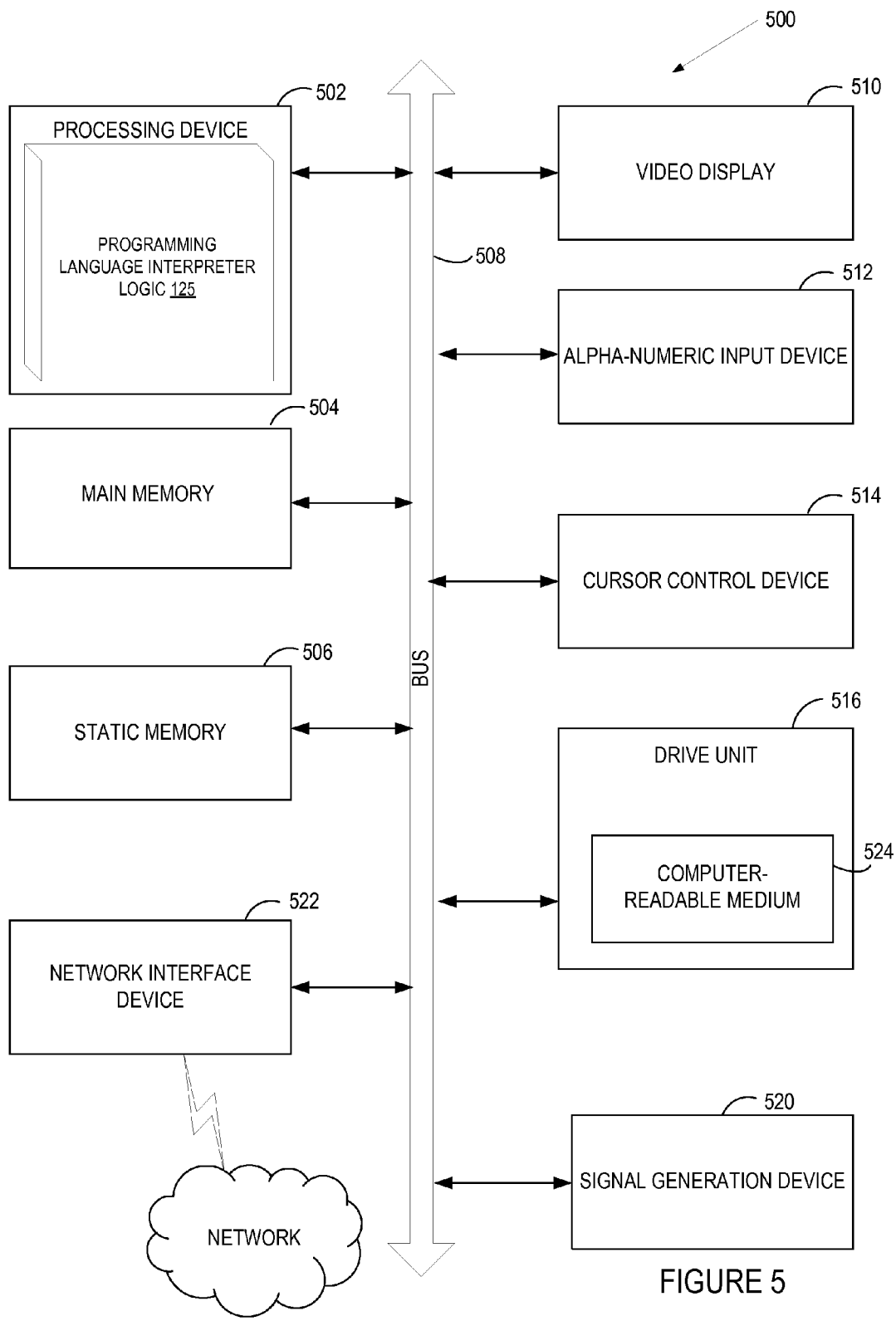
FIG. 5 illustrates an exemplary computing system, according to an embodiment of the present invention.

According to an embodiment, the application 110 source code that needs to be interpreted is sent through serial/parallel communication(s) to the interpreter-implemented hardware 120 or is made accessible through a memory (e.g., main memory 504 shown in FIG. 5). The various functionalities of interpretation, such as, for example, source parsing, communication to I/O, symbol table lookup, string handling, numeric computation, memory handling etc. may be implemented as individual hardware modules (i.e., an arrangement of hardware components (e.g., gates, arrays) configured to perform certain interpretation functionality) that are interconnected in the interpreter-implemented hardware 120. In an embodiment, as shown in FIG. 2, the interpreter-implemented hardware 120 includes a source parser hardware module 210, a communications hardware module 220, a symbol table lookup hardware module 230, a string handler hardware module 240, a numeric computation hardware module 250, a memory hardware module 260, etc., wherein each hardware module includes programming language interpreter logic 125 configured to perform the corresponding interpretation functionality. It should be noted that the interpreter-implemented hardware component(s) 120 may include other hardware modules having programming language interpreter logic 125 configured to perform other interpretation functionality in addition to the exemplary hardware modules shown in FIG. 2.

In operation, according to the embodiment shown in FIG. 1A, the user computer(s) 102 submit one or more requests (e.g., HTTP requests) to the one or more applications 110 configured to provide a response to the request. To do so, the application 110 passes the request to the interpreter-implemented hardware 120 in the application's native programming language (or source code). The interpreter-implemented hardware component 120 is configured to directly execute the source code to produce the response to the request, which may be returned by the application 110 to the user computer 102.

Figure 1B:
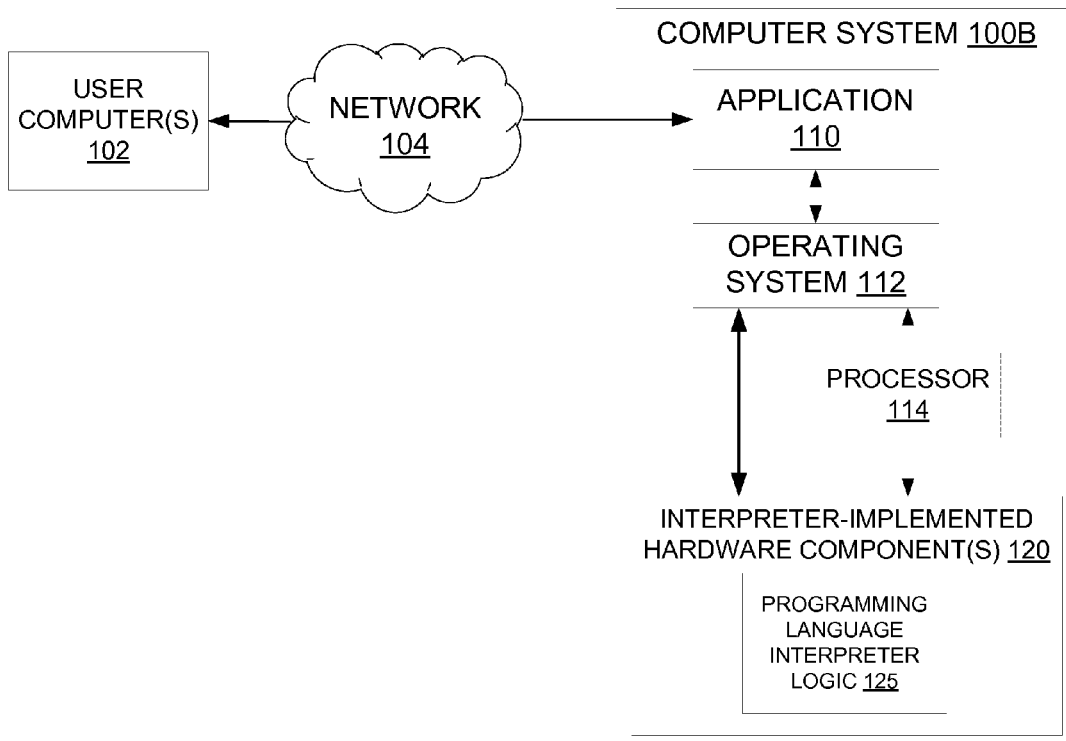
FIG. 1B is a block diagram of an exemplary computer architecture including an interpreter-implemented hardware component, according to an embodiment of the present invention.

According to an embodiment illustrated in FIG. 1B, a computer system 100B is provided which includes an operating system 112 configured to receive requests passed from the application(s) 110. The operating system 112 may communicate the requests directly to the interpreter-implemented hardware component 120 or, optionally (as denoted by the dashed lines in FIG. 1B), the operating system 112 can make a request to a processor 114 (also referred to as a "co-processor"), which in turn can arrange for the request to be processed by the interpreter-implemented hardware component 120. In an embodiment, the request from the application 110 includes a header tag that is used by the processor 114 to determine if the request should be processed by the processor 114 or off-loaded to the interpreter-implemented hardware component 120. One having ordinary skill in the art will appreciate that any suitable operating system may be used in computer system 100B, such as Microsoft Windows®, Linux®, Solaris®, Mac® OS, etc.

Figure 3:
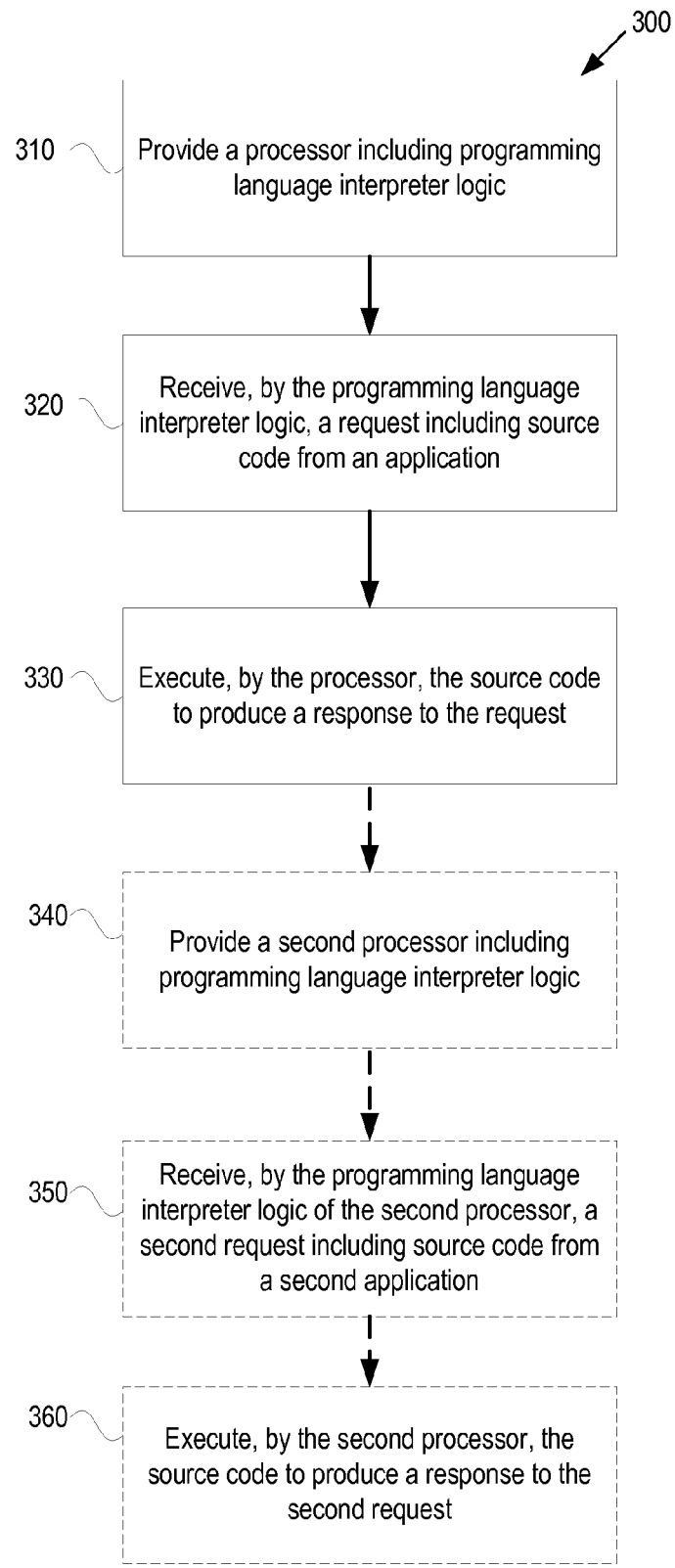
FIG. 3 is a flow diagram of embodiments of a method for implementing a hardware-based language interpreter.

FIG. 3 is a flow diagram illustrating one embodiment of a method 300 for processing a request from a user computer (e.g., user computers 102 of FIGS. 1 and 2) by a computer system according to embodiments of the present invention. The method 300 may be performed by a computer system that may comprise hardware (e.g., circuitry, dedicated logic, programmable logic, microcode, etc.), software (e.g., instructions run on a processing device), or a combination thereof. In one embodiment, the method 300 is performed by computer system 100A of FIG. 1A or computer system 100B of FIG. 1B.

Referring to FIG. 3, in one embodiment, the method 300 begins by providing access to a hardware component (e.g., a processor) including programming language interpreter logic in a computer system accessible by one or more user computers (e.g., user computers 102 of FIGS. 1 and 2), in block 310. In an embodiment, the interpreter-implemented hardware component (e.g., interpreter-implemented hardware component 120 of FIGS. 1 and 2) includes programming language interpreter logic (e.g., programming language interpreter logic 125 of FIGS. 1 and 2) configured to perform the actions, functionality, and processing of a virtual machine interpreter.

A request from a user computer is received by an application of the computer system. In block 320, the programming language interpreter logic of the interpreter-implemented hardware component receives the request including the application's source code from the application. Next, in block 330, the interpreter-implemented hardware component executes the source code to produce a response to the request. For example, if the source code includes a statement such as "display 'ABC'", then this source code is parsed by the interpreter-implemented hardware component (e.g., by a parser hardware module of the interpreter-implemented hardware component), and the output is sent to a video display (e.g., video display unit 510 shown in FIG. 5). In another example, if the source code includes a statement such as "I=I+1", then this source code is parsed by a parser hardware module of the interpreter-implemented hardware component 120, symbol table lookup hardware module, and memory hardware module, and the value of "I" is incremented by 1. In an embodiment, the response to the request is provided to the user computer by the application.

Optionally, as denoted by the dashed lines in FIG. 3, blocks 340-360 may be performed according to an embodiment of method 300. In block 340, a second hardware component (e.g., a processor) including programming language interpreter logic is provided in the computer system. The programming language interpreter logic of the second interpreter-implemented hardware component receives a second request including source code from a second application, in block 350. The second request may be received from a different user computer than the first request or the same user computer as the first request.

In block 360, the second interpreter-implemented hardware component executes the source code to produce a response to the second request. In an embodiment, the response to the second request is provided to the user computer by the second application.

In an embodiment, the interpreter-implemented hardware component provided in block 310 may be dedicated to processing requests from the application (i.e., the application described in connection with block 320) and the second interpreter-implemented hardware component (provided in block 350) may be dedicated to processing requests from the second application.

Figure 4:
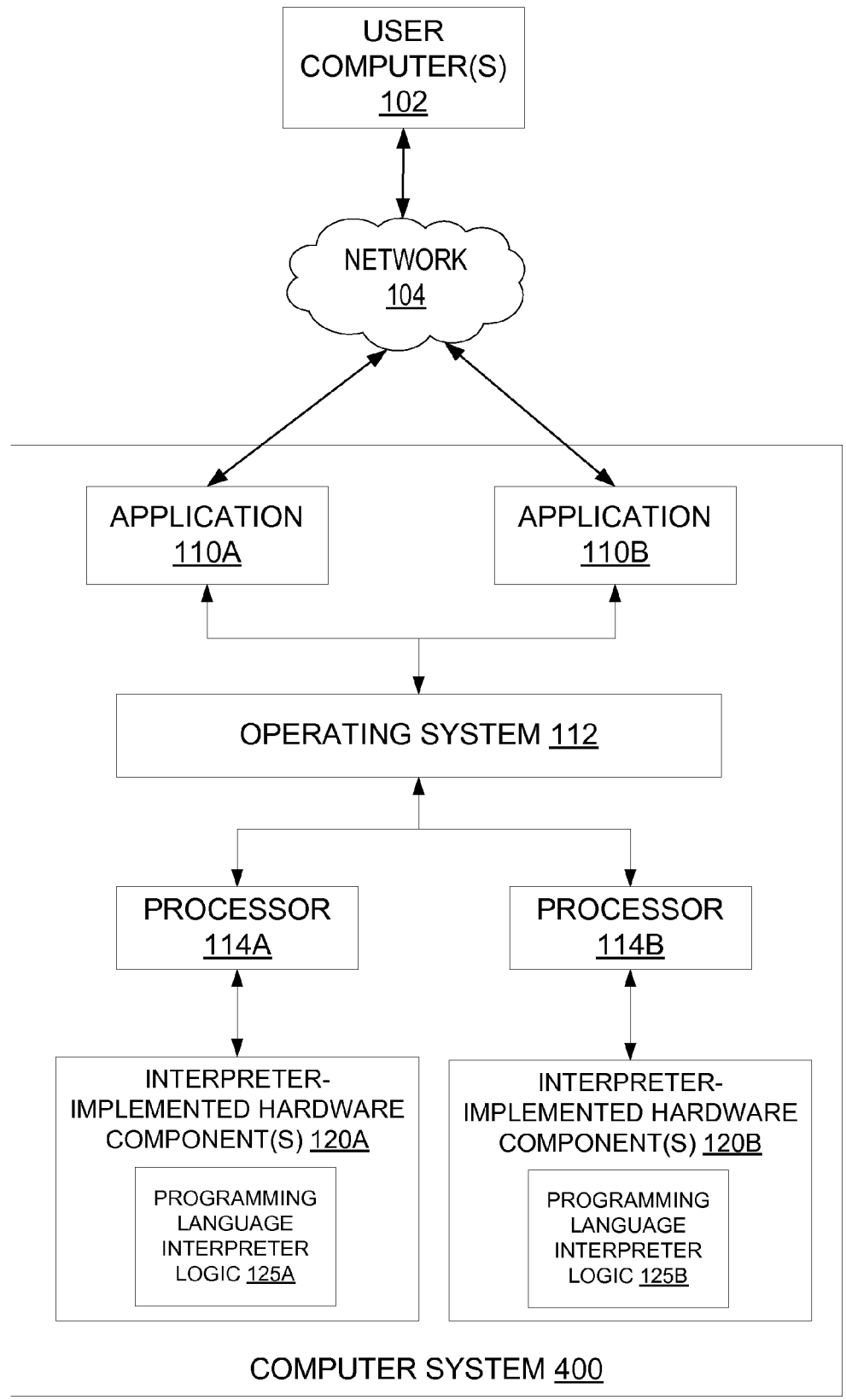
FIG. 4 illustrates a block diagram of an exemplary computer architecture including multiple language interpreter processors and multiple co-processors, according to an embodiment of the present invention.

FIG. 4 is a block diagram that illustrates an embodiment of a computer system 400 in which embodiments of the present invention may operate. The computer system 400 includes multiple applications (110A, 110B) accessible by one or user computers via network 104, an operating system 112, multiple co-processors (114A, 114B) and multiple interpreter-implemented hardware components (120A, 120B). The computer system 400 provides a multi-processor arrangement wherein each application (110A, 110B) is assigned a dedicated processor (114A, 114B) and a dedicated interpreter-implemented hardware component (120A, 120B) including programming language interpreter logic (125A, 125B) configured to handle user requests to the respective application, as described in detail in connection with method 300 illustrated in FIG. 3.

FIG. 5 illustrates an exemplary computer system 500 configured to perform any one or more of the methodologies discussed herein. In some embodiments, the computer system 500 may be connected (e.g., networked) to other machines in a LAN, an intranet, an extranet, or the Internet. The computer system 500 may operate in the capacity of a server machine in client-server network environment. The computer system 500 may be a personal computer (PC), a set-top box (STB), a server, a network router, switch or bridge, or any machine capable of executing a set of instructions (sequential or otherwise) that specify actions to be taken by that machine. Further, while only a single computer system 500 is illustrated, the term "computer system" shall also be taken to include any collection of machines that individually or jointly execute a set (or multiple sets) of instructions to perform any one or more of the methodologies discussed herein.

The exemplary computer system 500 includes a processing system (processing device) 502, a main memory 504 (e.g., read-only memory (ROM), flash memory, dynamic random access memory (DRAM) such as synchronous DRAM (SDRAM)), a static memory 506 (e.g., flash memory, static random access memory (SRAM)), and a data storage device 516, which communicate with each other via a bus 506.

Processing device 502 represents one or more general-purpose processing devices such as a microprocessor, central processing unit, or the like. More particularly, the processing device 502 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 502 may also be one or more special-purpose processing devices such as an application specific integrated circuit (ASIC), a field programmable gate array (FPGA), a digital signal processor (DSP), network processor, or the like. The processing device 502 may include programming language interpreter logic 125 configured to perform the operations and steps discussed herein.

The computer system 500 may further include a network interface device 522. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 520 (e.g., a speaker).

A drive unit 516 may include a computer-readable medium 524 on which is stored one or more sets of instructions embodying any one or more of the methodologies or functions described herein. The instructions may also reside, completely or at least partially, within the main memory 504 and/or within the processing device 502 during execution thereof by the memory management system 500, the main memory 504 and the processing device 502 also constituting computer-readable media. The instructions may further be transmitted or received over a network via the network interface device 522.

While the computer-readable storage medium 524 is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding, carrying, or being programmed with a set of instructions for execution by the machine and that cause the machine to perform any one or more of the methodologies of the present invention. The term "computer-readable storage medium" shall accordingly be taken to include, but not be limited to, solid-state memories, optical media, and magnetic media.

In the above description, numerous details are set forth. It will be apparent, however, to one of ordinary skill in the art having the benefit of this disclosure, that embodiments of the invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "providing", "receiving", "executing" or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments of the invention also relate to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

t is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   receiving, by a first application executed by a processing device, a first request from a user computer, the first request comprising source code in a native programming language of the first application;
   sending, by the first application executed by the processing device, the first request to an operating system executed by the processing device;
   generating, by the operating system executed by the processing device, a second request to interpret the native programming language of the first application;
   identifying, by the operating system executed by the processing device, a first processor comprising a first plurality of hardware components dedicated to interpreting and executing the native programming language of the first application;
   receiving, by the first plurality of hardware components from the operating system, the second request comprising the source code in the native programming language of the first application;
   executing, by the first plurality of hardware components, the source code received from the operating system to produce a response to the first request;
   sending, by the first plurality of hardware components to the operating system, the response to the first request; and
   sending, by the operating system, the response to the first application.

2. The method of claim 1, wherein the first plurality of hardware components comprise a first plurality of gates and arrays.

3. The method of claim 1, wherein the first plurality of hardware components comprise capability to perform source code interpretation functionality comprising at least one of source code parsing, communication handling, symbol table lookup, string handling, numeric computation, or memory handling.

4. The method of claim 1, wherein a computational time associated with receiving the source code from the first application and executing the source code is on an order of nanoseconds.

5. The method of claim 1, further comprising:
   receiving, by the second plurality of hardware components of the second processor, a second request comprising source code directly from the second application; and
   executing, by the second programming language interpreter logic if the second processor, the source code from the second application to produce a response to the second request.

6. A computer system comprising:
   an operating system executed by a processing device, the operating system to:
      receive a first request from a first application, the first request comprising first source code in a native programming language of the first application;
      generate a second request to interpret the native programming language of the first application; and
      identify a first processor comprising a first plurality of hardware components to interpret and execute the native programming language of the first application; and
   the first processor comprising the first plurality of hardware components to:
      receive, by the first plurality of hardware components from the operating system, the second request comprising the first source code in the native programming language of the first application,
      execute, by the first plurality of hardware components, the first source code in the native programming language of the first application to produce a response to the first request; and
      send, by the first plurality of hardware component to the operating system, the response to the first request.

7. The computer system of claim 6, wherein the first plurality of hardware components comprise capability to perform source code interpretation functionality comprising at least one of source code parsing, communication handling, symbol table lookup, string handling, numeric computation, or memory handling.

8. The computer system of claim 6, wherein the first plurality of hardware components comprise a first plurality of gates and arrays.

9. The system of claim 6, further comprising:
a second processor comprising a second plurality of hardware components to perform source code interpretation functionality associated with a second application, wherein the second-plurality of hardware components is dedicated to the second application, the second processor to:
receive, from the operating system, second source code associated with a request, the second source code in a native programming language of the second application, and
execute the second source code in the native programming language of the second application to produce a response to the request.

10. A computer system comprising:
an operating system executed by a processor, the operating system to:
receive a first request from a first application, the first request comprising a header tag and first source code in a native programming language of the first application; and
generate a second request to interpret and execute the native programming language of the first application, the second request comprising the header tag and the first source code;
the processor to:
receive the second request from the operating system;
identify a first processor comprising a first plurality of hardware components to interpret and execute the native programming language of the first application;
send, in view of the header tag, the second request to the first plurality of hardware components; and
the first plurality of hardware components to:
receive the first source code in the native programming language of the first application,
execute the first source code to produce a response to the first request; and
send, by the first plurality of hardware components to the operating system, the response to the first request.

11. The computer system of claim 10, the plurality of hardware components to perform source code interpretation functionality.

12. The computer system of claim 11, wherein the source code interpretation functionality comprises at least one of source code parsing, communication handling, symbol table lookup, string handling, numeric computation, or memory handling.

13. The computer system of claim 11, wherein the plurality of hardware components comprises a plurality of gates and arrays.

* * * * *